(12) United States Patent
Girvin et al.

(10) Patent No.: US 11,185,879 B2
(45) Date of Patent: Nov. 30, 2021

(54) SYSTEMS AND METHODS FOR CALIBRATING FLOW AND FOR COATING A SUBSTRATE

(71) Applicant: NORDSON CORPORATION, Westlake, OH (US)

(72) Inventors: Timothy A. Girvin, San Diego, CA (US); Camille I. Sybert, Carlsbad, CA (US); Alan R. Lewis, Carlsbad, CA (US); Gary A. Kephart, Carlsbad, CA (US); Michael Szuch, Oceanside, CA (US)

(73) Assignee: Nordson Corporation, Westlake, OH (US)

(*) Notice: Subject to any disclaimer, the term of this patent is extended or adjusted under 35 U.S.C. 154(b) by 154 days.

(21) Appl. No.: 16/178,572

(22) Filed: Nov. 1, 2018

(65) Prior Publication Data
US 2019/0240689 A1 Aug. 8, 2019

Related U.S. Application Data

(63) Continuation-in-part of application No. 15/892,106, filed on Feb. 8, 2018, now abandoned.

(51) Int. Cl.
*B05B 12/08* (2006.01)
*B05B 9/04* (2006.01)
(Continued)

(52) U.S. Cl.
CPC .......... *B05B 12/085* (2013.01); *B05B 9/0403* (2013.01); *B05B 12/12* (2013.01);
(Continued)

(58) Field of Classification Search
CPC ................................ B05D 1/02; B05B 12/085
See application file for complete search history.

(56) References Cited

U.S. PATENT DOCUMENTS 7,028,867 B2 * 4/2006 Acum .................... B05B 7/066
222/504
9,789,497 B1 10/2017 Orla-Jensen et al.
(Continued)

FOREIGN PATENT DOCUMENTS

| CN | 104812500 A | 7/2015 |
|---|---|---|
| CN | 105944865 A | 9/2016 |

(Continued)

OTHER PUBLICATIONS

ISA/220—Notification of Transmittal of Search Report and Written Opinion of the ISA, or the Declaration dated Apr. 10, 2019 for WO Application No. PCT/US19/013038.

*Primary Examiner* — Nathan T Leong
(74) *Attorney, Agent, or Firm* — BakerHostetler

(57) ABSTRACT

Systems and methods for applying a liquid coating to a substrate are disclosed herein. One exemplary method includes calibrating flow rate of a material through a coating system. A target flow rate for the material through a spray nozzle is received, a first operating pressure of the coating system based upon the target flow rate is calculated, and the material is ejected onto a least part of a surface with the material flowing through the spray nozzle at the first operating pressure of the coating system. Subsequent to a comparison between an operating flow rate and the target flow rate, the operating pressure is adjusted to a second operating pressure and at least part of the substrate is sprayed with the material flowing through the spray nozzle at the second operating pressure of the coating system.

25 Claims, 5 Drawing Sheets

(51) Int. Cl.
*H05K 3/28* (2006.01)
*H05K 3/00* (2006.01)
*B05B 12/12* (2006.01)
*G05D 7/06* (2006.01)
*B05C 11/10* (2006.01)
*B05D 1/02* (2006.01)

(52) U.S. Cl.
CPC ............ *B05C 11/1005* (2013.01); *B05D 1/02* (2013.01); *G05D 7/0635* (2013.01); *H05K 3/0091* (2013.01); *H05K 3/28* (2013.01); *H05K 2203/1366* (2013.01)

(56) References Cited

U.S. PATENT DOCUMENTS

| | | |
|---|---|---|
| 2004/0104244 A1 | 6/2004 | Cline et al. |
| 2006/0099335 A1* | 5/2006 | Sakai .................. B05B 13/0207 427/171 |
| 2014/0138400 A1* | 5/2014 | Donner ............... B05C 11/1013 222/1 |
| 2017/0043366 A1 | 2/2017 | Dufault et al. |

FOREIGN PATENT DOCUMENTS

| | | |
|---|---|---|
| CN | 106132561 A | 11/2016 |
| WO | 2015/168074 A1 | 11/2015 |
| WO | 2017/048688 A1 | 3/2017 |
| WO | 2017/222781 A1 | 12/2017 |

* cited by examiner

SYSTEMS AND METHODS FOR CALIBRATING FLOW AND FOR COATING A SUBSTRATE

CROSS-REFERENCE TO RELATED APPLICATIONS

This application is a continuation-in-part of U.S. patent application Ser. No. 15/892,106, filed Feb. 8, 2018, the entire contents of which is incorporated herein by reference.

TECHNICAL FIELD

The present disclosure relates generally to dispensing liquid coating materials and, more particularly, to systems and methods for applying liquid coating material, such as a conformal coating material, to a substrate, such as a circuit board.

BACKGROUND

Many industrial applications require the use of discrete, well-defined and uniform coatings applied to predetermined areas. Such coatings are useful in varied processes, such as conformal coatings on non-uniform or irregular substrates like electronic circuit boards. In the production of discrete coatings for application to discrete substrate areas, for example, it is desirable to obtain broad, uniform coatings in a non-contact application process with sharp, square, cut-on and cut-off edges with no stringing of material. In particular, conformal coating material is used to protect selected components of a circuit board from moisture, dirt, etc.

A satisfactory coating of a substrate with a material includes both the adequate coverage of the material on the surface of the substrate and the application of the material in a desired amount (e.g., thickness). There exists a need for calibrating and controlling flow for substrate coating to account for both the coverage of the material and the amount of material applied.

SUMMARY

Disclosed herein are systems and methods for applying a liquid coating to a substrate. In one embodiment, a method of calibrating flow rate of a material through a spray nozzle of a coating system for applying the material to a substrate includes receiving a target flow rate for the material through the spray nozzle. The method further includes calculating a first operating pressure of the coating system based upon the target flow rate for the material through the spray nozzle and a pressure-flow relationship between operating pressure of the coating system and flow rate of the material through the spray nozzle. The method also includes setting an operating pressure of the coating system to the first operating pressure and ejecting at least part of a surface with the material flowing through the spray nozzle at the first operating pressure of the coating system. The method further includes determining an operating flow rate of the material at the first operating pressure of the coating system, comparing the operating flow rate to the target flow rate, and adjusting, subsequent to the comparing of the operating flow rate to the target flow rate, the operating pressure of the coating system to a second operating pressure. The method includes spraying at least part of the substrate with the material flowing through the spray nozzle at the second operating pressure of the coating system.

In another embodiment, a method of calibrating a coating system includes receiving a target total volume for a material flowing through a coating system during a coating application routine and performing a first production cycle by spraying one or more substrates with the material flowing through a spray nozzle of the coating system operating the coating application routine. The method further includes collecting, concurrently with the performing of the first production cycle, first volume measurements of the material flowing through the coating system during the coating application routine, and determining, subsequent to a completion of the performing of the first production cycle and based upon the first volume measurements, a first total volume of the material that flowed through the coating system during the coating application routine. The method also includes comparing the first total volume with the target total volume and determining, in response to the comparing of the first total volume to the target total volume, that a difference between the first total volume and the target total volume is outside of a predetermined volume control range and subsequently adjusting an operating parameter of the coating application routine. The method also includes performing, subsequent to the adjustment of the operating parameter of the coating application routine, a second production cycle by spraying the one or more substrates with the material flowing through the spray nozzle of the coating system operating the coating application routine with the adjusted operating parameter.

Various additional features and advantages of this invention will become apparent to those of ordinary skill in the art upon review of the following detailed description of the illustrative embodiments taken in conjunction with the accompanying drawings.

BRIEF DESCRIPTION OF DRAWINGS

The following detailed description is better understood when read in conjunction with the appended drawings. For the purposes of illustration, examples are shown in the drawings; however, the subject matter is not limited to the specific elements and instrumentalities disclosed. In the drawings.

Detailed Description of Illustrative Embodiments

Figure 1:
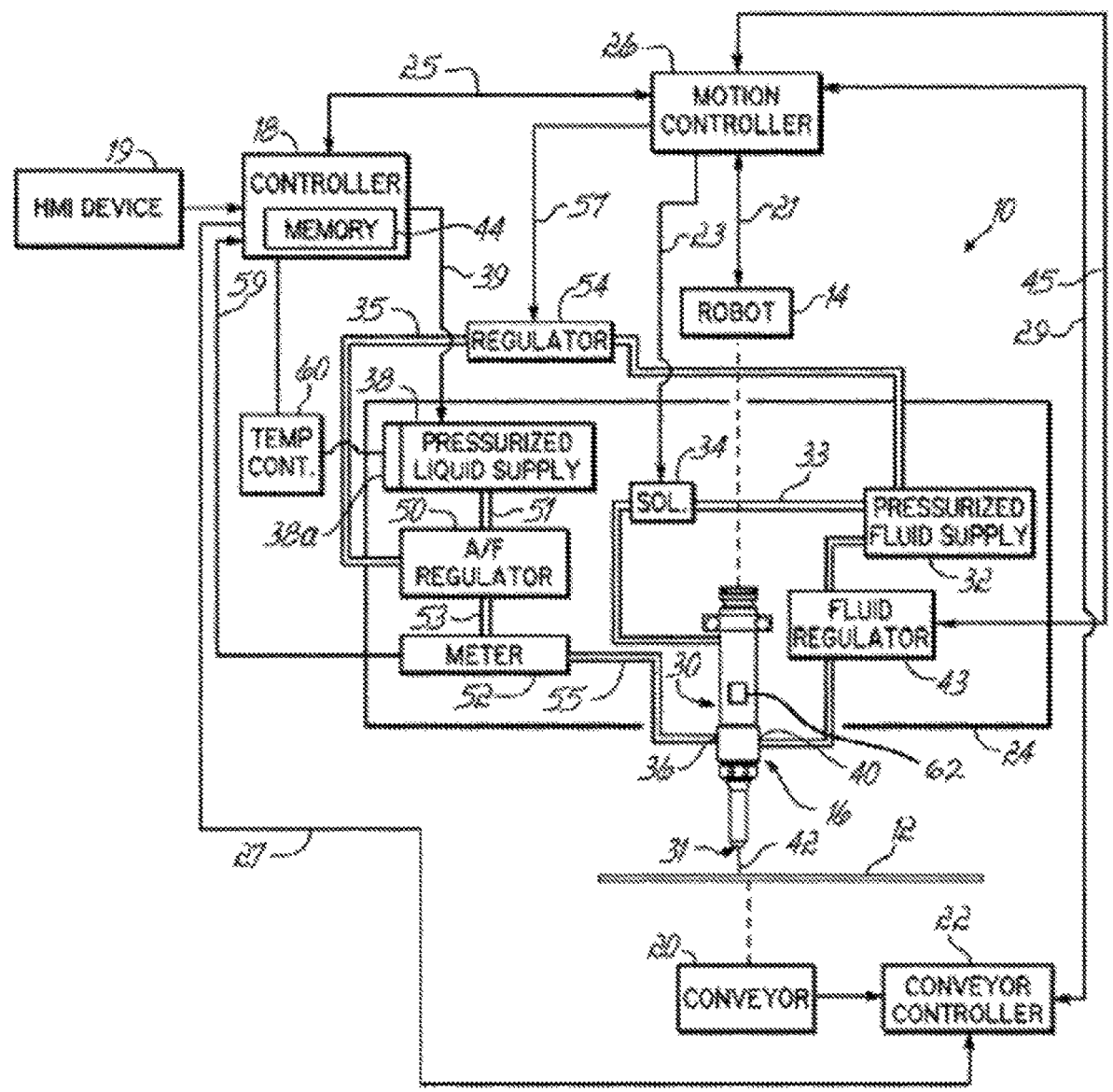
FIG. 1 illustrates a schematic view of a computer-controlled coating system in accordance with an embodiment of the invention.

With reference to FIG. 1, a coating system 10 may be used to apply a liquid coating material, such as a conformal coating material, to a series of substrates, such as the representative substrate 12. Although the operation of a representative coating system 10 will be described herein, those skilled in the art will appreciate that a wide variety of other coating systems may be used to complete the methods described below.

In the representative embodiment, the coating system 10 includes a multi-axis electro-mechanical positioner or robot 14 and a conformal coating applicator 16 coupled with the robot 14. For example, the applicator 16 may be suspended from the robot 14 above the substrate 12. In one embodiment, the robot 14 is adapted to move the applicator 16 in directions defined within an X-Y-Z Cartesian coordinate frame to supply three degrees of freedom. The robot 14 includes a drive coupled to independently controllable motors (not shown) in a known manner. The applicator 16 is manipulated by robot 14 relative to the substrate 12 for applying amounts of liquid coating material to selected areas of the substrate 12, as described in exemplary embodiments below.

A programmable controller 18 coordinates the movements and actuations of the coating system 10. The controller 18 may be a programmable logic controller (PLC), a microprocessor based controller, personal computer, or another conventional control device capable of carrying out the functions described herein as understood by a person having ordinary skill in the art. For example, the controller 18 may perform the various flow control/calibration routines described in detail below. A human machine interface (HMI) device 19 is operatively connected to the controller 18 in a known manner. The HMI device 19 may include input devices and controls, such as a keypad, pushbuttons, control knobs, a touch screen, etc., and output devices, such as displays and other visual indicators, that are used by an operator to control the operation of the controller 18 and, thereby, control the operation of the coating system 10. The HMI device 19 may further include an audio output device, such as a speaker, by which an audio alert may be communicated to an operator.

Substrates 12, for example, printed circuit boards with attached semiconductor die and other components, are supported in an operative relationship with the applicator 16 in a known manner and liquid coating material may be applied from the applicator 16 onto selected areas on each substrate 12. Depending on the dispensing application, a series of substrates 12 may be coated in a batch mode. Alternatively, the substrates 12 may be continuously transported past the applicator 16 on an automatic conveyor 20. The conveyor 20 may have a conventional design and, furthermore, may have a width that can be adjusted to accommodate substrates 12 of different dimensions. The conveyor 20, which may also include pneumatically operated lift and lock mechanisms (not shown), receives command signals from a conveyor controller 22.

The applicator 16 is electrically coupled with an applicator controller 24, which supplies command signals that control the operation of the applicator 16. A motion controller 26 is electrically coupled by a communication link 21 with the robot 14. The solenoid 34 is electrically coupled by a communication link 23 with the motion controller 26. The conveyor controller 22 and motion controller 26 are also electrically coupled with controller 18 over respective communication links 25, 27. The motion controller 26 is electrically coupled over a communication link 29 with the conveyor controller 22. Thus, a programmable control system for coating system 10 includes the controller 18, the applicator controller 24, the motion controller 26, and the optional conveyor controller 22 as interconnected components that communicate with each other.

The motion controller 26 supplies command signals to the robot 14 over the communication link 21. The command signals are used by the robot 14 to control the position and/or velocity of the applicator 16. Generally, the robot 14 includes electric motors (e.g., servo motors, stepper motors, etc.) that drive the motion of the different axes of the robot 14.

Applicator 16 includes a body 30 suspended from the robot 14, a nozzle 31 (e.g., a spray nozzle) mounted to one end of the body 30, and a flow control mechanism (not shown) disposed inside the body 30. The flow control mechanism inside the body 30 may comprise an air-actuated needle, an air piston, and a valve seat that cooperate to form a dispensing valve (not shown) operative to control a flow of conformal coating material dispensed from the applicator 16. A pressurized fluid supply 32 and a solenoid 34 cooperate to supply pressurized fluid in a known manner to regulate the actuation of the dispensing valve inside the body 30. Specifically, the solenoid 34 controls air pressure in a conduit 33 connecting the pressurized fluid supply 32 with the applicator 16 so as to move the air piston and, thereby, move the needle relative to the valve seat to provide an opened position for the dispensing valve in which liquid coating material is dispensed from the applicator 16 onto the substrate 12. The solenoid 34 may vent the air pressure acting on the air piston to permit the needle to return to a closed position in which the needle contacts the valve seat to discontinue the dispensing.

The coating system 10 may include a fan width sensor 62 that may be disposed, for example, external to the applicator 16 but within the robot 14 approximately level with the substrate 12. In some aspects, the fan width sensor 62 may also be a separate module independent from the robot 14 and the applicator 16. The fan width sensor 62 may be configured to determine various characteristics (e.g., width, shape, etc.) of the fan of the material dispensed from the applicator 16. As used herein, the fan of the material refers to the shape, and dimensions thereof, of the stream 42 of material from the applicator 16. For example, the applicator 16 may dispense the material in a conical spray at a known distance between the applicator 16 and the substrate 12, whereby the conical spray will produce a circular area of coating on the substrate 12 with a certain diameter. As the applicator 16 moves along the substrate 12, the conical spray of the material will produce a strip of coating on the substrate 12 having a width corresponding with the certain diameter of the conical spray. The fan width sensor 62 may be communicatively connected with the motion controller 26 and/or controller 18. For instance, the data points indicative of the fan of material and determined by the fan width sensor 62 may be communicated to the controller 18 and stored in the memory 44 therein.

In an aspect of the disclosure, the fan width sensor 62 may include a camera and a light or laser source, wherein the stream 42 of material may be positioned between the camera and the light or laser source to determine the various characteristics (e.g., width, shape, etc.) of the stream 42 of material. The camera may be configured to capture images of the fluid pattern of the stream 42 as it is dispensed from the applicator 16. The images captured by the camera may be still images or images that comprise a video stream. The camera may forward the images of the fluid pattern to the controller 18, which may use the images to perform other processing steps, such as a fan width control routine. The light or laser source may be configured to emit light or a laser through the fluid pattern of the stream 42. For example, the light or laser source may be located directly in front of the camera on the other side of the applicator 16 and on the same horizontal plane as the camera. The light or laser source may provide illumination of the fluid pattern of the stream 42 to improve image quality of the images captured by the camera. The fan width sensor 62 configured as such may allow the fan width or other characteristics of the stream 42 to be determined and, possibly, adjusted in real-time while a substrate 12 is coated.

The coating system 10 includes a pressurized liquid supply 38 that operates in a known manner under the command of controller 18 to generate a continuous stream or supply of the pressurized liquid coating material. For example, the pressurized liquid supply 38 may include a diaphragm or piston pump that siphons amounts of liquid coating material from a reservoir and then pumps the stream of liquid coating material under pressure from the reservoir through a fluid path to the applicator 16. The pressurized liquid supply 38 is electrically connected by a communication link 39 with the controller 18, which can regulate operating parameters such as the temperature and pressure of a liquid coating material by communicating appropriate control signals to the pressurized liquid supply 38 over communication link 39.

The pressurized liquid supply 38 is optionally configured with one or more conventional heating elements 38a that are electrically coupled with a conventional temperature controller 60 that is electrically coupled with the controller 18. The construction and operation of conventional heating elements, such as heating elements 38a, and temperature controllers, such as temperature controller 60, are understood by a person having ordinary skill in the art. In an alternative embodiment, the applicator 16 may include a heating element (not shown) or a heating element (not shown) may be disposed in the one of the conduits 51, 53, 55. Regardless of the specific location of the heating element in the flow path between the pressurized liquid supply 38 and the nozzle 31, the liquid coating material may be heated in this flow path before being applied to the substrate 12.

The applicator 16 includes a liquid inlet 36 that is coupled in fluid communication with a pressurized liquid supply 38. The liquid coating material is supplied from the pressurized liquid supply 38 to the applicator 16 through the liquid inlet 36 for regulated dispensing out of a dispensing orifice (not shown) in the nozzle 31. The body 30 has a fluid inlet 40 coupled with pressurized fluid supply 32 and internal passageways (not shown) that direct the pressurized fluid to outlets in the vicinity of the dispensing orifice in nozzle 31, where the pressurized fluid is discharged to interact with and manipulate the stream 42 of liquid coating material that is sprayed from the applicator 16. A fluid regulator 43, which communicates over communication link 45 with motion controller 26, controls the flow of pressurized fluid from the pressurized fluid supply 32 to the fluid inlet 40. A representative applicator similar to applicator 16 is described in U.S. Pat. No. 7,028,867, the disclosure of which is hereby incorporated by reference herein in its entirety.

With continued reference to FIG. 1, an "air over fluid" (A/F) regulator 50 and a flow meter 52 are situated in the flow path for the liquid coating material from the pressurized liquid supply 38 to the liquid inlet 36 of the applicator 16. As a result, the liquid coating material is constrained to flow through the A/F regulator 50 and flow meter 52 in transit from the pressurized liquid supply 38 to the applicator 16. A liquid input of the A/F regulator 50 is coupled by a conduit 51 with a liquid outlet of the pressurized liquid supply 38. Similarly, the A/F regulator 50 has a liquid outlet coupled by a conduit 53 with a liquid input of the flow meter 52, which in turn has a liquid outlet coupled by a conduit 55 with the liquid inlet 36 of the applicator 16.

The A/F regulator 50 controls the fluid pressure of the pressurized liquid material in transit in the fluid path to the applicator 16. The controller 18 is electrically coupled by a communication link 57 with a regulator 54. In one embodiment, the regulator 54 may be a "voltage to pressure" (EP) regulator that receives a control voltage from the motion controller 26 and includes a transducer that converts the control voltage to a fluid pressure. Alternatively, the regulator 54 may receive a control current or a serial communications signal, instead of a control voltage, for conversion to a fluid pressure. The regulator 54 delivers pressurized fluid to the A/F regulator 50 for use in controlling the fluid pressure of the liquid coating material flowing through the A/F regulator 50.

The A/F regulator 50 is positioned in a conduit 35 defining a fluid path between the pressurized liquid supply 38 and the flow meter 52. In an alternative embodiment, the flow meter 52 may be positioned in the fluid path between the pressurized liquid supply 38 and the A/F regulator 50 so that the flow meter 52 is upstream from the A/F regulator 50. With this alternative arrangement, the A/F regulator 50 would alter the pressure of the liquid coating material after the liquid coating material has flowed through the flow meter 52.

The controller 18 is electrically coupled by a communication link 59 with the flow meter 52. In response to the flow of liquid coating material from conduit 53 to conduit 55, the flow meter 52 generates a string of counts or electrical pulses each representing a fixed volume of liquid coating material flowing through or past the flow meter 52. Alternatively, the string of electrical pulses from the flow meter 52 may be communicated from the flow meter 52 to the motion controller 26 and then relayed from the motion controller 26 to the controller 18. In one embodiment, the flow meter 52 may comprise a gear meter that rotates in response to flow through the gear meter and, for a fixed amount of rotation representing a known volume, generates an electrical pulse with an encoder that is transmitted as an electrical signal in a signal stream to the controller 18. For example, the gear meter may generate a pulse for every 0.04 cubic centimeters of liquid coating material flowing through the flow meter 52. In another embodiment, the flow meter 52 may comprise a thermal mass flow meter.

The coating system 10 may be operated as instructed by a library of operational cycles or sequences that are stored in a memory 44 associated with the controller 18 and/or stored in other computers. The operational sequences are recalled and placed in a particular operational program (e.g., a coating application routine), executed by the controller 18. The controller 18 may transfer an entire operational program and/or a batch of instructions and data as electrical signals directly or indirectly (i.e., via wired or wireless connections) to various structures of the coating system 10 that are under operational control of the controller 18.

According to aspects of embodiments of the invention, one more production cycles may be performed by the coating system 10. During performance of the one or more production cycles, one or more substrates 12 may be matched by the controller 18 with a coating application routine. The coating application routine may be a particular operational program that, when executed by the controller 18, causes the coating system 10 to spray specific areas of the one or more substrates 12 with predetermined amounts of liquid coating material flowing from the nozzle 31 (e.g., for forming predetermined coating patterns on the one or more substrates 12, for applying the liquid coating material on or around components on the substrate 12, etc.).

The coating application routine may include parameters entered into the HMI device 19 by a user. The parameters may be stored in the memory 44 of controller 18 and may be used immediately or subsequently to generate and/or modify the coating application routine. The parameters may correspond to, for example, the type of substrate 12, an identifier of the substrate 12, a description of substrate 12, the assist air pressure, the velocity of the applicator 16, the type of liquid coating material, the pressure of the liquid coating material, a target flow rate for the material through the nozzle 31, the distance between the substrate 12 and applicator 16, target coating thickness of the material, target coating width of the material, the solids percentage of the material, a total volume of the liquid coating material for a given production cycle etc. At least some of the parameters that form the basis of the coating application routine may be adjusted, e.g., to accommodate different environmental conditions, different types of substrates 12, different types of conformal coating material, or to compensate for fluctuations in the operation of structures the coating system 10 arising from use of the system.

For example and in reference to FIG. 1, the controller 18 may obtain and/or generate the coating application routine for the substrate 12 based upon the parameters entered into the HMI device 19 stored in the memory 44. The controller 18 may determine, based upon the coating application routine, the specific areas of the substrate 12 to be coated with the liquid coating material. The liquid coating material may be applied to the specific areas, e.g., in strips or dots. In one exemplary embodiment, twenty-five separate components or areas of a substrate 12 may be coated with strips of the liquid coating material.

The controller 18 may retrieve the coating application routine from the memory 44 and if necessary, the controller 18 may modify aspects of the coating application routine. The controller 18 may communicate the control signals to the motion controller 26 over communication link 25 representing an operational sequence of the coating application routine. The motion controller 26 may send command signals to the robot 14 over communication link 21 that instruct the robot 14 to move the applicator 16 at specified velocities, as set forth in the coating application routine, to desired locations with respect to the substrate 12. The motion controller 26 controls the movements of the robot 14 to move the applicator 16 in a plane (e.g., X and Y directions) across the substrate 12, opening and closing the dispensing valve in the applicator 16 as necessary during this movement to apply the liquid coating material to the desired components and areas of the substrate 12.

Specifically, at any particular location on substrate 12, the motion controller 26 also provides a command signal to the solenoid 34 to cause the solenoid 34 to change state to open the dispensing valve causing discharge of liquid coating material from nozzle 31. Concurrently, the motion controller 26 provides command signals to the robot 14 to initiate motion of the applicator 16 relative to the substrate 12. The stream 42 of liquid coating material may be optionally manipulated by an assist fluid, such as air, that affects the shaping of the stream 42 discharged from the applicator 16. After a predetermined time lapses, the motion controller 26 subsequently changes the state of the valve command signal to return the solenoid 34 back to its original state. This action closes the dispensing valve to discontinue the discharge of liquid coating material from the nozzle 31 of the applicator 16. The motion controller 26 may cause the dispensing valve of the applicator 16 to open and close the dispensing valve multiple times (e.g., twenty-five times) during the extent of the coating application routine so that multiple components and areas of the substrate 12 receive an amount of liquid coating material.

During the coating application routine or in preparation for the execution of the coating application routine, the controller 18 provides electrical signals to the motion controller 26, which prompt the motion controller 26 to provide command signals to the regulator 54. The regulator 54 controls an air pressure supplied to the A/F regulator 50 to select a liquid pressure for the pressurized liquid coating material flowing from the pressurized liquid supply 38 to the applicator 16. The selected value of liquid pressure, which is dispensing application dependent, may further depend on the desired flow rate of the liquid coating material. The flow rate for the liquid coating material is influenced, among other factors, by the liquid pressure, the diameter of the discharge orifice in the dispensing nozzle 31, the material viscosity, etc. Specific processes for flow control of parameters affecting the distribution/amount of material sprayed during operation of the coating system 10, such as the target coating width of the material controlled via fan width control of the nozzle 31, are described in U.S. Pat. No. 9,789,497, the disclosure of which is hereby incorporated by reference herein in its entirety. Nevertheless, the exemplary processes for calibrating flow rate of a material disclosed herein may utilize an atomized spray nozzle 31. By utilizing the atomized spray nozzle 31, a width of the spray pattern may remain relatively constant across a range of operating parameters of the coating system 10 including, e.g., a wide range of operating pressures of the coating system 10.

Figure 2:
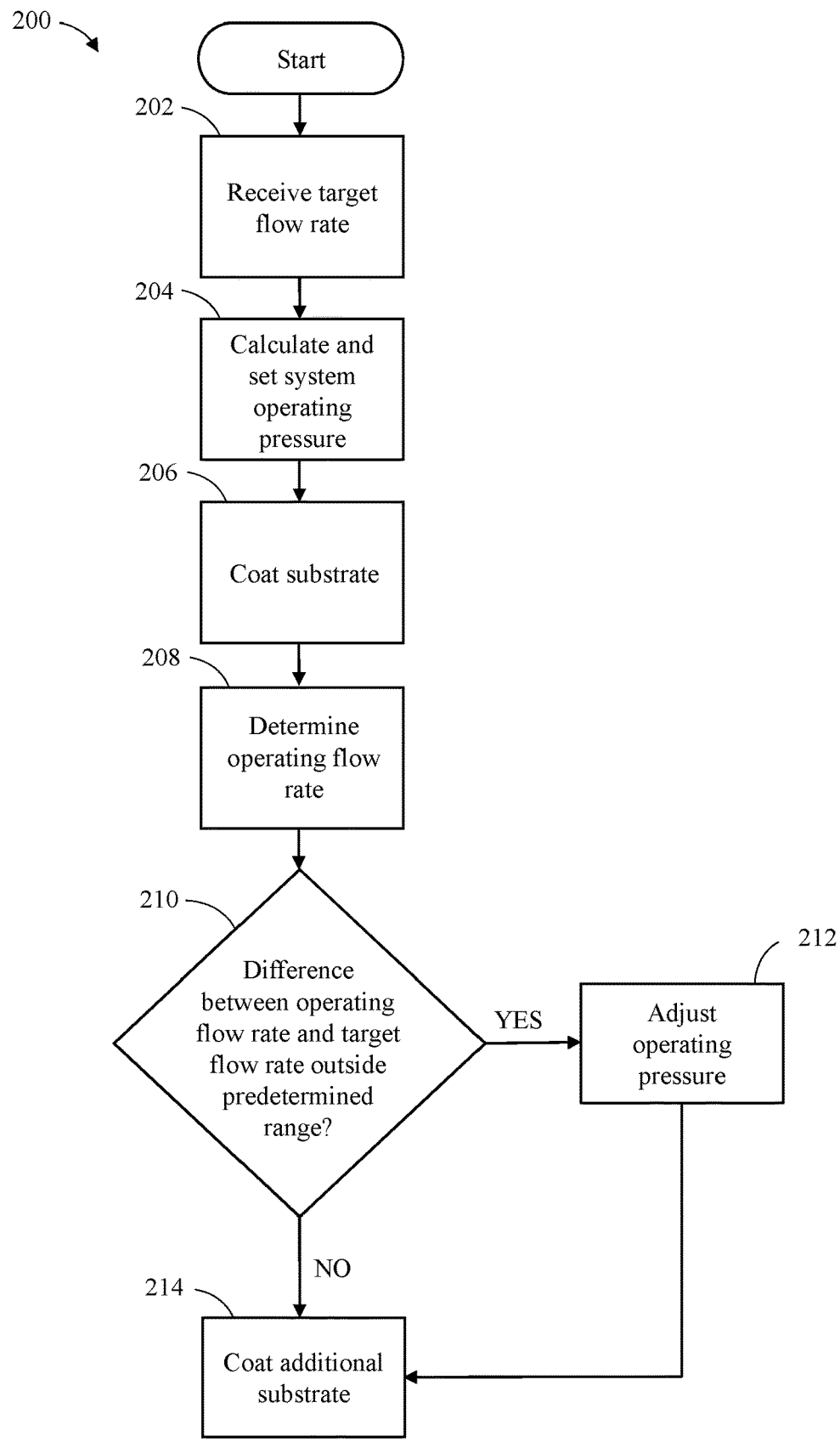
FIG. 2 illustrates a flow diagram of an exemplary method in accordance with an embodiment of the invention.

FIG. 2 illustrates a flow diagram of an exemplary process 200 for calibrating flow rate of a material applied to one or more substrates 12 through the nozzle 31 of the coating system 10. The process 200 may be executed, at least in part, by the motion controller 26 and/or controller 18. Generally, the process 200 may include a flow control routine (steps 202-214) including calculating and setting a first operating pressure of the coating system 10 based upon a received target flow rate for the material through the nozzle 31 and a pressure-flow relationship (i.e., a relationship between operating pressure of the coating system 10 and flow rate of the material through the nozzle 31). When a difference between a determined operating flow rate and the received target flow rate is outside of a predetermined control range (e.g., ±a predetermined percentage of the target flow rate), the process 200 may adjust the operating pressure of the coating system 10 to a second operating pressure prior to coating one or more additional substrates 12.

At step 202 of the process 200, the coating system 10 may receive a target flow rate for the material through the nozzle 31. For example, an operator may enter the target flow rate into the HMI device 19. The target flow rate may be stored in the memory 44 of controller 18 for use in the process 200.

In accordance with aspects of the disclosure, the target flow rate received by the coating system 10 may be calculated, manually or automatically, based upon received operating parameters of the coating system 10. The received operating parameters may include, e.g., the target coating thickness of the material, the target coating width of the material, the solids percentage of the material, and the velocity of the applicator 16 of the coating system 10. The operating parameters may, for example, be input by the operator into the HMI device 19 and stored in the memory 44 of the controller 18 for automatic calculation of the target flow rate.

Upon receipt of the target coating width of the material operating parameter, the controller 18 may set an operating parameter of the coating system 10 which may be predicted to produce a coating width of the material that achieves (i.e., as accurately as possible) the target coating width of the material. For example, the memory 44 of the controller 18 may include the following target coating width equation:

$$\frac{W}{2 \times \tan\left(\frac{\theta}{2}\right)} = H$$

In the target coating width equation, "H" is the vertical distance (i.e., height) between an outlet of the nozzle 31 and a nozzle-facing surface of the substrate 12, "θ" is an angle formed by a spray pattern of the material emanating from the nozzle 31, and "W" is the received target coating width of the material. The angle θ may be another operating parameter of the coating system 10 that may be a function of the particular spray nozzle 31 and/or material utilized in the coating system 10. The angle θ may be measured (i.e., manually or automatically) as the material is sprayed from the spray nozzle 31. The angle θ may be input by the operator into the HMI device 19 and stored in the memory 44 of the controller 18.

In embodiments, the target coating width equation may be modified by multiplying the received target coating width "W" by a correction factor. For example, for low viscosity materials (e.g., under 150 cps) the received target coating width "W" may be modified by a correction factor greater than 1 (e.g., 1.1) to account for material flow out from the spray pattern resulting from the low viscosity of the material. Alternatively, other influences (e.g., surface tension or shrinkage of the material) may make the use of a correction factor of greater than or less than 1 advantageous. If a correction factor is utilized in the exemplary processes for calibrating flow rate of a material disclosed herein, the correction factor may be held constant throughout any given process.

The controller 18 may automatically calculate the distance H between the nozzle 31 and the substrate 12 that the target coating width equation predicts will achieve the received target coating width "W" during operation of the coating system 10. The automatic calculation of the distance H may be based upon the target coating width equation and the values for the angle θ and the received target coating width "W" stored in the memory 44 of the controller 18. The controller 18 may set the distance H between the nozzle 31 and the substrate 12 for the coating system 10 to the calculated distance H by controlling movement of the robot 14.

Calculation of the target flow rate may include solving, manually or automatically, the following target flow rate equation:

$$\left(\frac{T \times W}{\frac{P}{100}}\right) \times S = FR$$

In the target flow rate equation, "T" is the received target coating thickness of the material, "W" is the received target coating width of the material, "P" is the received solids percentage of the material, "S" is the received velocity of the applicator 16, and "FR" is the calculated target flow rate. The received solids percentage of the material is by volume. The calculated target flow rate "FR" in the target flow rate equation is a volumetric target flow rate. The calculated target flow rate "FR" may be converted to a mass flow rate by multiplying the calculated target flow rate "FR" by the density of the material, as would be readily understood by a person having ordinary skill in the art. Solving the equation may also include, where appropriate, unit conversions to normalize any unit discrepancies between the input operating parameters, as would be readily understood by a person having ordinary skill in the art. When the target flow rate is automatically calculated, the controller 18 may recall the operating parameters stored in the memory 44 and may utilize the operating parameters to solve the target flow rate equation for FR, i.e., the calculated target flow rate for the material through the nozzle 31. Accordingly, the calculated target flow rate may correspond to the target flow rate received at step 202 utilized in the process 200.

According to aspects of the disclosure, it may be determined that the target flow rate calculated using the operating parameters input by the operator is outside of a predetermined flow rate capacity range of the coating system 10. The predetermined flow rate capacity range of the coating system 10 may be a range of flow rates that may be reliably achieved by the coating system 10, which may be a function of the capacity of the coating system 10 and/or of properties of the coating material, as would be readily understood by a person having ordinary skill in the art. In response to a determination that the calculated target flow rate is outside of the predetermined flow rate capacity range, the velocity of the applicator 16 operating parameter may be adjusted to bring the calculated target flow rate within the predetermined flow rate capacity range. Adjusting the velocity of the applicator 16 operating parameter while keeping constant the remaining operating parameters entered into the target flow rate equation that affect coating properties (i.e., the target coating thickness, the target coating width of the material, the solids percentage of the material) allows for an adjustment of the calculated target flow rate within the predetermined flow rate capacity range without altering the coating characteristics desired by the operator. The adjustment of the velocity of the applicator 16 operating parameter may be the result of an iterative process. For example, the velocity of the applicator 16 operating parameter may be iteratively adjusted and reentered until the target flow rate calculated from the target flow rate equation falls within the predetermined flow rate capacity range.

Alternatively, the adjustment of the velocity of the applicator 16 operating parameter may be the result of a calculation solving the target flow rate equation for the velocity of the applicator 16 operating parameter using a set target flow rate and holding all other operating parameters constant. The set target flow rate may, for example, be an outer bound of the predetermined flow rate capacity range, or may alternatively be any flow rate within the predetermined flow rate capacity range. As a non-limiting numeric example, the predetermined flow rate capacity range of an exemplary coating system 10 may be between 0.1 ml/min and 10.0 ml/min. If a target flow rate using the operating parameters input by the operator is calculated to be 12.0 ml/min (i.e., outside of the predetermined flow rate capacity range), the target flow rate may be set to 10.00 ml/min (i.e., the outer upper bound of the predetermined flow rate capacity range of the exemplary coating system 10). The velocity of the applicator 16 operating parameter may be adjusted by solving the target flow rate equation for the velocity of the applicator 16 operating parameter using the set target flow rate and holding all other operating parameters constant.

That is, the target flow rate equation may be rewritten to solve for the velocity of the applicator 16 as the following adjusted velocity equation:

$$\left(\frac{\frac{P}{100}}{T \times W}\right) \times FR' = S'$$

In the adjusted velocity equation, "T" is the received target coating thickness of the material, "W" is the received target coating width of the material, "P" is the received solids percentage of the material, "FR'" is the set target flow rate, and "S'" is the adjusted velocity of the applicator 16. The received solids percentage of the material is by volume. The set target flow rate "FR'" in the target flow rate equation is a volumetric target flow rate. The set target flow rate "FR'" may be converted to a mass flow rate by multiplying the set target flow rate "FR'" by the density of the material, as would be readily understood by a person having ordinary skill in the art. Solving the equation may also include, where appropriate, unit conversions to normalize any unit discrepancies between the input operating parameters, as would be readily understood by a person having ordinary skill in the art. The adjusted velocity of the applicator 16 may, for example, be automatically calculated whereby the controller 18 may recall the operating parameters stored in the memory 44 and the set target flow rate, which may be utilized to solve the adjusted velocity equation for S', i.e., the adjusted velocity of the applicator 16. Accordingly, the coating system 10 may be operated at the adjusted velocity of the applicator 16 and at the set target flow rate. The set target flow rate may correspond to the target flow rate received at step 202.

At step 204, the first operating pressure of the coating system 10 may be calculated. The first operating pressure of the coating system 10 may be calculated based upon the target flow rate for the material through the nozzle 31 and the pressure-flow relationship. In addition, the operating pressure of the coating system 10 may be set to the first operating pressure. For example, under command of the controller 18 the operation of the pump of the pressurized liquid supply 38 may be adjusted to increase or decrease the operating pressure of the material supplied to the applicator 16 to set the coating system 10 to the first operating pressure.

The pressure-flow relationship may be a function of the structure of the nozzle 31 and properties of the material that passes through the nozzle 31. The pressure-flow relationship may be used, for example, to determine an operating pressure of the coating system 10 (e.g., the first operating pressure) that is predicted to achieve a particular operating flow rate of the material ejected from the nozzle 31 (e.g., the target flow rate) and to result in coating characteristics desired by the operator (e.g., the target coating thickness). In embodiments, the pressure-flow relationship may be entered by an operator into the HMI device 19 and may be stored in the memory 44 of controller 18 for use in the process 200.

Alternatively, the pressure-flow relationship may be calculated. For example, the material may be ejected from the nozzle 31, e.g., into a container while the coating system 10 operates at a first calibrating pressure and a first flow rate of the material ejected from the nozzle 31 may be determined. As the material is ejected from the nozzle 31, the amount of material ejected and the time that the material is ejected may be measured, which may be used to determine the first flow rate. For example, as the material flows from the pressurized liquid supply 38 and out the applicator 16, the flow meter 52 may transmit to the controller 18 a count or electrical pulse for each fixed amount of material passing through the flow meter 52. As another example, the amount of material ejected may be measured according to a differential in the weight of the remaining material in the pressurized liquid supply 38. According to yet another example, the amount of material collected in the container may be measured. The amount of material may be measured volumetrically and/or by weight. The controller 18 may, for example, measure the total time that the material is ejected. The first flow rate of the material may be determined from the measured amount of material ejected over the measured amount of time that the material was ejected, as would be readily understood by a person having ordinary skill in the art.

The operating pressure of the coating system 10 may be adjusted to a second, third, fourth, . . . n calibrating pressure(s) that is/are different from (i.e., higher or lower than) the first calibrating pressure. The coating system 10 may eject the material from the nozzle 31 while the coating system 10 operates at the second, third, fourth, . . . n calibrating pressure(s) and a second, third, fourth, . . . n flow rate(s) of the material ejected from the nozzle 31 may be determined. That is, as the material is ejected from the nozzle 31, the amount of material ejected and the amount of time that the material is ejected may be measured (e.g., in accordance with any of the above described techniques), which may be used to calculate the respective flow rate(s).

The pressure-flow relationship may be calculated based upon the first calibrating pressure and the first flow rate. In addition to the first calibrating pressure and corresponding first flow rate, the pressure-flow relationship may be calculated based upon, e.g., the second, third, fourth . . . n calibrating pressures and the corresponding second, third, fourth . . . n flow rates. The pressure-flow rate relationship may be calculated/modeled as, e.g., a simple linear regression model, based upon any number of calibrating pressures and corresponding flow rates, as would be readily understood by a person having ordinary skill in the art. The relationship between the flow rate and the operating pressure may be presumed to be proportional. Accordingly, the relationship may be modeled using only a single calibrating pressure and corresponding measured flow rate. Alternatively, the relationship may be modeled using a plurality of operating pressures and corresponding flow rates without requiring a proportional pressure-flow rate presumption. The model may be used as a predictive function to calculate a pressure/flow rate based upon a known flow rate/pressure. Accordingly, the model may be used to calculate the first operating pressure of the coating system 10 based upon the target flow rate received at step 202 and the operating pressure of the coating system 10 may be set to the first operating pressure.

At step 206, a substrate 12, or portion thereof (e.g. a portion of a nozzle-facing surface of the substrate 12), may be coated with the material. That is, at least a part of the substrate 12 may be sprayed with the material flowing through the nozzle 31 while the coating system 10 is operated at the first operating pressure. Alternatively, the spraying of the substrate 12 may be delayed until step 214, described below. In this regard, the spraying of step 206 may be provided on any surface, for example, a surface of a container or purge cup.

At step 208, an operating flow rate of the material may be determined. For example, the operating flow rate of the material flowing through the coating system 10 during the coating of the substrate 12 may be determined in situ. That is, as the substrate 12 is coated with the material, the amount of material may be measured over a measured amount of time. For example, as the material flows from the pressurized liquid supply 38 and out the applicator 16, the flow meter 52 may transmit to the controller 18 a count or electrical pulse for each fixed amount of material passing through the flow meter 52 over a measured period of time. As another example, the amount of material applied to the substrate 12 may be measured according to a differential in the weight of the remaining material in the pressurized liquid supply 38. The amount of material may be measured volumetrically and/or by weight.

Alternatively, after the substrate 12 is sprayed with the material, the material may further be ejected from the nozzle 31, e.g., into a container while the coating system 10 operates at the first operating pressure and an operating flow rate of the material ejected from the nozzle 31 may be determined. For example, as the material flows from the pressurized liquid supply 38 and out the applicator 16 into the container, the flow meter 52 may transmit to the controller 18 a count or electrical pulse for each fixed amount of material passing through the flow meter 52. As another example, the amount of material ejected into the container may be measured according to a differential in the weight of the remaining material in the pressurized liquid supply 38. According to yet another example, the amount of material collected in the container may be measured. The amount of material may be measured volumetrically and/or by weight. The controller 18, for example, may measure the total time that the material is ejected. The operating flow rate of the material at the first operating pressure may be determined from the measured amount of material over the measured amount of time that the material was sprayed/ejected, as would be readily understood by a person having ordinary skill in the art.

At step 210, the operating flow rate of the material determined at step 208 may be compared to the received target flow rate and it may be determined whether the determined operating flow rate is outside of a predetermined control range. The predetermined control range may, for example, be within ±5% of the target flow rate. In another example, the predetermined control range may be within ±1% of the target flow rate. If the difference between the determined operating flow rate and the target flow rate is outside of the predetermined control range, the process 200 may proceed to step 212.

In embodiments, steps 208 and 210 of the process 200 may be performed during step 206, i.e., during the coating of the substrate 12 at the first operating pressure. For example, the operating flow rate of the material flowing through the coating system 10 during the coating of the substrate 12 may be determined (i.e., measured) and may be compared to the target flow rate in situ. If the measured operating flow rate of the material is outside of the predetermined control range, the velocity of the applicator 16 may be compensated (i.e., adjusted) during the coating of the substrate 12 at step 206. By adjusting the velocity of the applicator 16 during the coating of the substrate 12, the resultant coating on the substrate 12 may more closely approximate, e.g., the target coating thickness of the material.

The adjustment of the velocity of the applicator 16 operating parameter may be proportional to a difference between the measured operating flow rate and the target operating flow rate. Alternatively, the adjustment of the velocity of the applicator 16 operating parameter may be the result of a calculation solving the following modified adjusted velocity equation:

$$\left(\frac{\frac{P}{100}}{T \times W}\right) \times FR'' = S'$$

In the modified adjusted velocity equation, "T" is the received target coating thickness of the material, "W" is the received target coating width of the material, "P" is the received solids percentage of the material, "FR'''" is the measured operating flow rate, and "S'" is the adjusted velocity of the applicator 16. The received solids percentage of the material is by volume. The measured operating flow rate "FR'" in the target flow rate equation is a volumetric target flow rate. The measured operating flow rate "FR'''" may be converted to a mass flow rate by multiplying the measured operating flow rate "FR'''" by the density of the material, as would be readily understood by a person having ordinary skill in the art. Solving the equation may also include, where appropriate, unit conversions to normalize any unit discrepancies between the input operating parameters, as would also be readily understood by a person having ordinary skill in the art. The adjusted velocity of the applicator 16 may, for example, be automatically calculated whereby the controller 18 may recall the operating parameters stored in the memory 44 and the measured operating flow rate "FR'''," which may be utilized to solve the adjusted velocity equation for S', i.e., the adjusted velocity of the applicator 16. Accordingly, the coating system 10 may be operated at the adjusted velocity of the applicator 16 in response to an in situ determination that the measured operating flow rate is outside of the predetermined control range.

If the difference between the determined operating flow rate and the target flow rate is within the predetermined control range, the process 200 may store the operating flow rate of the material determined at step 208 in the memory 44 of the controller 18 and may proceed directly to step 214. In addition, aspects of the process 200 may be iterative and subsequent iterations of step 210 may provide an alternate condition that may trigger step 212 of the process 200. For example, as additional substrates 12 are coated in step 214 (described below), this may also be considered as restarting the process 200 at step 206. For second, third, fourth, . . . n iterations of steps 208 and 210, respective second, third, fourth, . . . n operating flow rate(s) may be determined, compared to the received target flow rate, and stored in the memory 44 of the controller 18. If the difference between any of the subsequently determined operating flow rates and the target flow rate is outside of the predetermined control range, the process 200 may proceed to step 212.

Further, as a result of repeated iterations of step 208, trends may be calculated (i.e., manually or automatically via the controller 18) based upon each of the determined operating flow rates. The calculated trends may form an alternate condition for triggering step 212 of the process 200. The process 200 may proceed from step 210 to step 212 based upon the calculated trends even when the determined operating flow rate is within the predetermined control range. For example, according to embodiments of the invention, prior to the adjusting the operating pressure of the coating system 10 to the second operating pressure (e.g., step 212), the controller 18 may determine, in response to the comparing of the operating flow rate to the target flow rate (e.g., step 210), that a difference between the first operating flow rate and the target flow rate is within the predetermined control range. Subsequently, the controller 18 may cause the coating system 10 to spray at least part of the substrate 12 or another substrate 12 with the material flowing through the nozzle 31 at the first operating pressure of the coating system 10. The controller 18 may determine, subsequent to the spraying of the at least part of the substrate 12 or the other substrate 12, a second operating flow rate of the material at the first operating pressure, and the second operating flow rate may be different from the first operating flow rate. The controller 18 may calculate a rate of change between the first operating flow rate and the second operating flow rate. The process 200 may proceed to step 212 (discussed below), whereby the controller 18 may adjust the operating pressure of the coating system 10 to the second operating pressure in response to the rate of change between the first and second operating flow rates.

In general, a rate of change of the operating flow rate per iteration of steps 206-214 of the process 200 may be calculated. If the rate of change exceeds a pre-determined value, step 212 may be executed as though the operating flow rate was determined to be outside the predetermined control range, as discussed above. According to aspects of the disclosure, the operating pressure of the coating system 10 may be adjusted before the operating flow rate is outside of the predetermined control range.

At step 212, the operating pressure of the coating system 10 may be adjusted to a second operating pressure. For example, under command of the controller 18, operation of the pump of the pressurized liquid supply 38 may be adjusted to increase or decrease the operating pressure of the material supplied to the applicator 16 to set the operating pressure of the coating system 10 to the second operating pressure. In one example, the operating pressure of the coating system 10 may be increased or decreased from the first operating pressure to the second operating pressure in proportion to the determined difference between the determined operating flow rate and the target flow rate. As a non-limiting numeric example, if the determined operating flow rate is 2% above the target flow rate, the second operating pressure may be 2% less than the first operating pressure.

In another example, the pressure-flow relationship between operating pressure of the coating system 10 and flow rate of the material through the nozzle 31 may be calculated or recalculated to determine the second operating pressure necessary to achieve the target flow rate. That is, alternately or in addition to the determination that the difference between the determined operating flow rate and the target flow rate is outside of the predetermined control range, it may be determined that at least one of a property of the material (e.g., viscosity) and the structure of the nozzle 31 (e.g., an expansion due to an increase in temperature) has changed during operation of the coating system 10. As result, the pressure-flow relationship between operating pressure of the coating system 10 and flow rate of the material through the nozzle 31 utilized in step 204 may no longer be representative of the material/coating system 10 and the pressure-flow relationship may be recalculated or recalibrated, in accordance with any of the above described techniques.

For example, the process 200 may include recalibrating the pressure-flow relationship between operating pressure of the coating system 10 and the flow rate of the material through the nozzle 31 subsequent to the determination that the difference between the operating flow rate and the target flow rate is outside of the predetermined control range (e.g., step 210) and prior to the adjustment of the operating pressure of the coating system 10 to the second operating pressure (e.g., step 212).

The recalibrating of the pressure-flow relationship may be determined by an operator and may be entered into the HMI device 19 and may be stored in the memory 44 of controller 18 for use in the process 200.

Alternatively, the recalibrating of the pressure-flow relationship may be the result of calculation or recalculation. For example, the material may be ejected from the nozzle 31, e.g., into a container while the coating system 10 operates at a first calibrating pressure and a first flow rate of the material ejected from the nozzle 31 may be determined. As the material is ejected from the nozzle 31, the amount of material ejected and the time that the material is ejected may be measured, which may be used to determine the first flow rate. For example, as the material flows from the pressurized liquid supply 38 and out the applicator 16, the flow meter 52 may transmit to the controller 18 a count or electrical pulse for each fixed amount of material passing through the flow meter 52. As another example, the amount of material ejected may be measured according to a differential in the weight of the remaining material in the pressurized liquid supply 38. According to yet another example, the amount of material collected in the container may be measured. The amount of material may be measured volumetrically and/or by weight. The controller 18 may, for example, measure the total time that the material is ejected. The first flow rate of the material may be determined from the measured amount of material ejected over the measured amount of time that the material was ejected, as would be readily understood by a person having ordinary skill in the art.

The operating pressure of the coating system 10 may be adjusted to a second, third, fourth, . . . n calibrating pressure(s) that is/are different from (i.e., higher or lower than) the first calibrating pressure. The coating system 10 may eject the material from the nozzle 31 while the coating system 10 operates at the second, third, fourth, . . . n calibrating pressure(s) and a second, third, fourth, . . . n flow rate(s) of the material ejected from the nozzle 31 may be determined. That is, as the material is ejected from the nozzle 31, the amount of material ejected and the amount of time that the material is ejected may be measured (e.g., in accordance with any of the above described techniques), which may be used to calculate the respective flow rate(s).

The recalibrated pressure-flow relationship may be calculated based upon the first calibrating pressure and the first flow rate. In addition to the first calibrating pressure and corresponding first flow rate, the recalibrated pressure-flow relationship may be calculated based upon, e.g., the second, third, fourth . . . n calibrating pressures and the corresponding second, third, fourth . . . n flow rates. The recalibrated pressure-flow rate relationship may be calculated/modeled as, e.g., a simple linear regression model, based upon any number of calibrating pressures and corresponding flow rates, as would be readily understood by a person having ordinary skill in the art. The relationship between the flow rate and the operating pressure may be presumed to be proportional. Accordingly, the relationship may be modeled using only a single calibrating pressure and corresponding measured flow rate. Alternatively, the relationship may be modeled using a plurality of operating pressures and corresponding flow rates without requiring a proportional pressure-flow rate presumption. The model may be used as a predictive function to calculate a pressure/flow rate based upon a known flow rate/pressure. Accordingly, the model may be used to calculate the second operating pressure of the coating system 10 based upon the target flow rate received at step 202 and the operating pressure of the coating system 10 may be set to the second operating pressure.

As shown in FIG. 2, the process 200 may proceed directly to step 214 upon completion of step 212. Alternatively, the process 200 may be iterative and upon completion of step 212 the process 200 may repeat steps 208 and 210 prior to proceeding to step 214. By repeating steps 208 and 210, the process 200 may verify (i.e., determine) that an operating flow rate of the material at the second operating pressure is within the predetermined control range prior to proceeding to step 214. According to aspects of the disclosure, verification of the operating flow rate of the material at the second operating pressure may improve the quality of the coating on addition substrates 12 provided at step 214 of the process 200, as set forth below.

Upon completion of the flow control routine, at step 214, additional substrates 12 may be coated with the material. The additional substrates 12 may be coated in accordance with one or more production cycles performed by the coating system 10. During performance of the one or more production cycles, one or more substrates 12 may be matched by the controller 18 with a coating application routine. As discussed above, the coating application routine may be a particular operational program that, when executed by the controller 18, causes the coating system 10 to spray specific areas of the one or more substrates 12 with predetermined amounts of liquid coating material flowing from the nozzle 31. The production cycle and associated coating application routine may be generated by a user and entered into the controller 18 via the HMI device 19. Additionally or alternatively, aspects of the production cycle and/or coating application routine may be determined in accordance with any of the processes described herein.

When more than one production cycle is performed, step 214 may include controlling the coating system 10 to maintain consistency of the coating process across production cycles based upon measurements of the volume of material flowing through the coating system 10 (e.g., made in situ via the flow meter 52) across the various production cycles. For example, the controller 18 may receive a target total volume for the material flowing through the coating system 10 during a coating application routine and may store the received target total volume in the memory 44. The target total volume may be entered into the controller 18 by a user via the HMI device 19.

Alternatively, the target total volume may be set by the coating system 10 based upon volume measurements collected during an actual performance of a production cycle. For example, the coating system 10 may perform a calibration production cycle by spraying the one or more substrates 12 with material flowing through the nozzle 31 while the coating system 10 operates a coating application routine. The controller 18 of the coating system 10 may collect, concurrently with the performance of the calibration production cycle, calibration volume measurements of the material flowing through the coating system 10 during operation of the coating application routine. For example, volume measurements may be collected by the flow meter 52. The controller 18 may determine, subsequent to a completion of the performance of the calibration production cycle and based upon the collected calibration volume measurements, a calibration total volume of the material that flowed through the coating system 10 during the coating application routine. The calibration total volume may be determined, for example, by a summation of each of the in situ calibration volume measurements collected during the calibration production cycle, as would be readily understood by a person having ordinary skill in the art. Upon determining the calibration total volume, the controller 18 may set the target total volume to a value equivalent to the calibration total volume. Thus, the target total volume may be set in response to an actual performance of the production cycle with the coating system 10 operating the coating application routine.

After the target total volume is set, the coating system 10 may perform one or more subsequent production cycles, e.g., a first production cycle, with the coating system 10 operating the same, or a substantially similar, coating application routine. Performance of the first production cycle may include spraying one or more substrates 12 with the material flowing through the nozzle 31 of the coating system 10 operating the coating application routine. The controller 18 may collect, concurrently with the performance of the first production cycle, first volume measurements of the material flowing through the coating system 10 during the coating application routine. As discussed above, volume measurements may be collected, for example, by the flow meter 52. The controller 18 may determine, subsequent to a completion of the performing of the first production cycle and based upon the collected first volume measurements, a first total volume of the material that flowed through the coating system 10 during the coating application routine.

The controller 18 may then compare the first total volume with the target total volume. According to embodiments of the invention, the controller 18 may determine whether a difference between the first total volume and the target total volume is outside of a predetermined volume control range. The predetermined volume control range may, for example, be within ±5% of the target total volume. In other embodiments, the predetermined volume control range may be within ±1% of the target total volume. If the controller 18 determines that the difference between the first total volume and the target total volume is within the predetermined volume control range, the controller 18 may direct the coating system 10 to perform subsequent production cycles without adjustment of the coating application routine.

Alternatively, if the controller 18 determines that the difference between the first total volume and the target total volume is outside of the volume control range, the controller 18 may adjust an operating parameter of the coating application routine prior to performance of subsequent production cycles. The operating parameter of the coating application routine may be adjusted in a manner predicted to compensate for the difference between the first total volume and the target total volume to maintain consistency of the coating process across production cycles.

For example, the operating parameter of the coating application routine adjusted by the controller 18 may include a velocity of the applicator 16 of the coating system 10 and/or a pressure of the material flowing through the coating system 10. The operating parameter of the coating application routine may be adjusted in proportion to the difference between the first total volume and the target total volume. For example, if the first total volume is determined to be less than the target total volume, the velocity of the applicator 16 may be decreased and/or the pressure of the material flowing through the coating system 10 may be increased in proportion to the difference between the first total volume and the target total volume, and vice versa.

In some embodiments, the operating parameter may be adjusted even when the controller 18 determines that the difference between the first total volume and the target volume is within the volume control range. For example, the controller 18 may store in the memory 44 a plurality of total volume measurements collected from a plurality of completed production cycles. The controller 18 may determine that a rate of change between the total volume measurements across the plurality of completed production cycles has reached a predetermined threshold and may adjust the operating parameter in response thereto.

Once the operating parameter of the coating application routine is adjusted, the coating system 10 may perform one or more subsequent production cycles by spraying the one or more substrates 12 with the material flowing through the nozzle 31 of the coating system 10 operating the coating application routine with the adjusted operating parameter. According to aspects of the invention, by monitoring the total volume across production cycles variations in material flow over time may compensated in a simplified manner.

At least some of the steps of the process 200 may be iterative. For example, as additional substrates 12 are coated in step 214, this may also be considered as restarting the process 200 at step 206, whereby the flow control routine of steps 206-214 may continue to iteratively adjust the pressure of the coating system 10, when appropriate and as set forth at steps 210 and 212, as it coats the additional substrates 12, and so forth.

Figure 3:
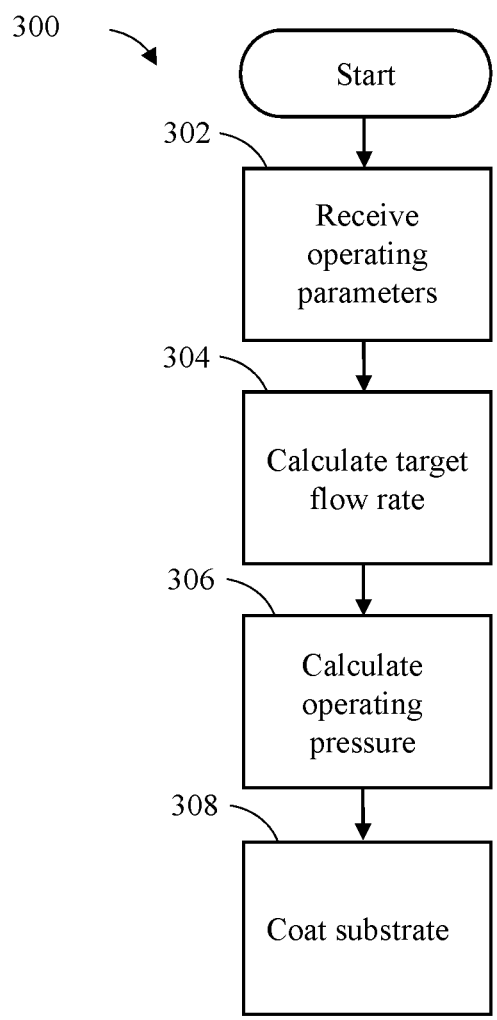
FIG. 3 illustrates a flow diagram of another exemplary method in accordance with an embodiment of the invention.

FIG. 3 illustrates a flow diagram of another exemplary process 300 for calibrating flow rate of a material applied to one or more substrates 12 through the nozzle 31 of the coating system 10. The process 300 may be executed, at least in part, by the motion controller 26 and/or controller 18. Generally, the process 300 may include a flow control routine (steps 302-308) including receiving operating parameters for the coating system 10 and calculating a target flow rate for the material through the nozzle 31. The process 300 may further include calculating a first operating pressure for the material based upon the target flow rate for the material through the nozzle 31 and a pressure-flow relationship (i.e., a relationship between operating pressure of the coating system 10 and flow rate of the material through the nozzle 31), and spraying at least part of the substrate 12 with the material.

At step 302 of the process 300, operating parameters of the coating system 10 may be received. The received operating parameters may include, e.g., the target coating thickness of the material, the target coating width of the material, the solids percentage of the material, and the velocity of the applicator 16 of the coating system 10. The operating parameters may, for example, be input by the operator into the HMI device 19 and stored in the memory 44 of the controller 18 for automatic calculation of the target flow rate.

At step 304, the target flow rate may be manually or automatically calculated based upon the operating parameters of the coating system 10 received at step 302. Calculation of target flow rate may include solving, manually or automatically, the target flow rate equation, as described above in aspects of the process 200. When the target flow rate is automatically calculated, the controller 18 may recall the operating parameters stored in the memory 44 and may utilize the operating parameters to solve the target flow rate equation for the target flow rate for the material through the nozzle 31.

According to aspects of the disclosure, it may be determined that the target flow rate calculated using the operating parameters input by the operator is outside of a predetermined flow rate capacity range of the coating system 10. The predetermined flow rate capacity range of the coating system 10 may be a range of flow rates that may be reliably achieved by the coating system 10. In response to a determination that the calculated target flow rate is outside of the predetermined flow rate capacity range, the velocity of the applicator 16 operating parameter may be adjusted to bring the calculated target flow rate within the predetermined flow rate capacity range, as described above in aspects of the process 200. Adjusting the velocity of the applicator 16 operating parameter while keeping constant the remaining operating parameters entered into the target flow rate equation that affect coating properties (i.e., the target coating thickness, the target coating width of the material, the solids percentage of the material) allows for an adjustment of the calculated target flow rate within the predetermined flow rate capacity range without altering the coating characteristics desired by the operator. The adjustment of the velocity of the applicator 16 operating parameter may be the result of an iterative process. For example, the velocity of the applicator 16 operating parameter may be iteratively adjusted and reentered until the target flow rate calculated from the target flow rate equation falls within the predetermined flow rate capacity range.

Alternatively, the adjustment of the velocity of the applicator 16 operating parameter may be the result of a calculation solving the target flow rate equation for the velocity of the applicator 16 operating parameter using a set target flow rate and holding all other operating parameters constant. The set target flow rate may, for example, be an outer bound of the predetermined flow rate capacity range, or may alternatively be any flow rate within the predetermined flow rate capacity range. The velocity of the applicator 16 operating parameter may be adjusted by solving the target flow rate equation for the velocity of the applicator 16 operating parameter using the set target flow rate and holding all other operating parameters constant. That is, the target flow rate equation may be rewritten and the velocity of the applicator 16 may be solved for using the adjusted velocity equation, as described above in aspects of the process 200. The adjusted velocity of the applicator 16 may, for example, be automatically calculated whereby the controller 18 may recall the operating parameters stored in the memory 44 and the set target flow rate, which may be utilized to solve the adjusted velocity equation for the adjusted velocity of the applicator 16. Accordingly, the coating system 10 may be operated at the adjusted velocity of the applicator 16 and at the set target flow rate.

At step 306, the first operating pressure of the coating system 10 may be calculated. The first operating pressure of the coating system 10 may be calculated based upon the target flow rate for the material through the nozzle 31 and the pressure-flow relationship, as described above in aspects of the process 200. In addition, the operating pressure of the coating system 10 may be set to the first operating pressure. For example, under command of the controller 18 the operation of the pump of the pressurized liquid supply 38 may be adjusted to increase or decrease the operating pressure of the material supplied to the applicator 16 to set the coating system 10 to the first operating pressure. In embodiments, the pressure-flow relationship may be entered by an operator into the HMI device 19 and may be stored in the memory 44 of controller 18 for use in the process 300. Alternatively, the pressure-flow relationship may be calculated, as described above in aspects of the process 200.

Upon completion of the control routine, at step 308, a substrate 12, or portion thereof, may be coated with the material. That is, at least a part of the substrate 12 may be sprayed with the material flowing through the nozzle 31 while the coating system 10 is operated at the first operating pressure. At least some of the steps of the process 300 may be iterative. For example, the process 300 may be restarted at step 304 to recalculate the flow rate and adjust the operating pressure of the coating system 10, as described above in aspects of the process 200. In addition, step 308 may be repeated to coat at least portions of additional substrates 12, and so forth.

Figure 4:
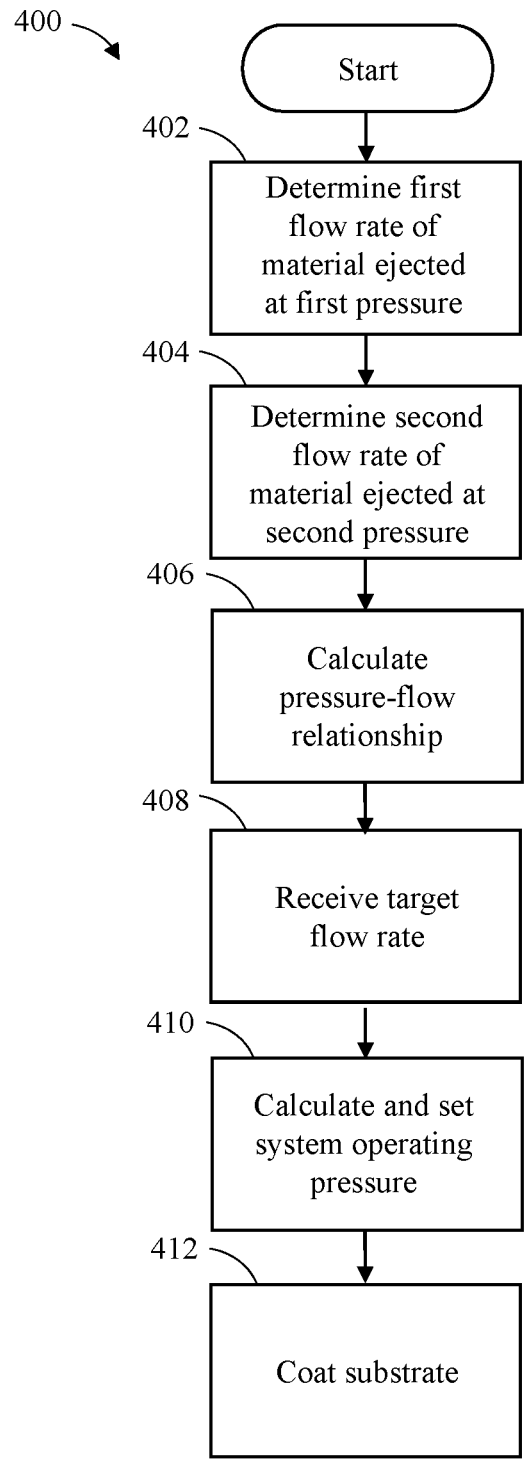
FIG. 4 illustrates a flow diagram of yet another exemplary method in accordance with an embodiment of the invention.

FIG. 4 illustrates a flow diagram of yet another exemplary process 400 for calibrating flow rate of a material applied to one or more substrates 12 through the nozzle 31 of the coating system 10. The process 400 may be executed, at least in part, by the motion controller 26 and/or controller 18. Generally, the process 400 may include a flow control routine (steps 402-412) including calculating a pressure-flow relationship (i.e., a relationship between operating pressure of the coating system 10 and flow rate of the material through the nozzle 31). The process 400 may further include calculating and setting a first operating pressure of the coating system 10 based upon a received target flow rate for the material through the nozzle 31 and the calculated pressure-flow relationship, as well as spraying at least part of the substrate 12 with the material.

At step 402, the material may be ejected from the nozzle 31, e.g., into a container while the coating system 10 operates at a first calibrating pressure and a first flow rate of the material ejected from the nozzle 31 may be determined. As the material is ejected from the nozzle 31, the amount of material ejected and the time that the material is ejected may be measured, which may be used to determine the first flow rate. For example, as the material flows from the pressurized liquid supply 38 and out the applicator 16, the flow meter 52 may transmit to the controller 18 a count or electrical pulse for each fixed amount of material passing through the flow meter 52. As another example, the amount of material ejected may be measured according to a differential in the weight of the remaining material in the pressurized liquid supply 38. According to yet another example, the amount of material collected in the container may be measured. The amount of material may be measured volumetrically and/or by weight. The controller 18 may, for example, measure the total time that the material is ejected. The first flow rate of the material may be determined from the measured amount of material ejected over the measured amount of time that the material was ejected.

At step 404, the operating pressure of the coating system 10 may be adjusted to a second calibrating pressure that is different from (i.e., higher or lower than) the first calibrating pressure. The coating system 10 may eject the material from the nozzle 31 while the coating system 10 operates at the second calibrating pressure and a second flow rate of the material ejected from the nozzle 31 at the second calibrating pressure may be determined. That is, as the material is ejected from the nozzle 31, the amount of material ejected and the amount of time that the material is ejected may be measured (e.g., in accordance with any of the above described techniques), which may be used to calculate the second flow rate.

At step 406, the pressure-flow relationship may be calculated based upon the first calibrating pressure, the first flow rate, the second calibrating pressure, and the second flow rate. In addition to the first and second calibrating pressures and corresponding first and second flow rates, the pressure-flow relationship may be calculated based upon, e.g., third, fourth . . . n calibrating pressures and corresponding third, fourth . . . n flow rates, which may be determined in a manner similar to the first and second flow rates described above. The pressure-flow rate relationship may be calculated as, e.g., a simple linear regression model, based upon the calibrating pressures and corresponding flow rates. The simple linear regression model may be used as a predictive function to calculate a pressure/flow rate based upon a known flow rate/pressure. In alternate embodiments, the relationship between the flow rate and the operating pressure may be presumed to be proportional. Accordingly, the relationship may be modeled using only a single calibrating pressure and corresponding measured flow rate, as described above in aspects of the process 200.

At step 408, a target flow rate for the material through the nozzle 31 may be received. For example, an operator may enter the target flow rate into the HMI device 19. The target flow rate may be stored in the memory 44 of controller 18 for use in the process 400. In accordance with aspects of the disclosure, the target flow rate received by the coating system 10 may be calculated, manually or automatically, based upon received operating parameters of the coating system 10, as described above in aspects of the processes 200 and 300.

At step 410, the first operating pressure of the coating system 10 may be calculated. The first operating pressure of the coating system 10 may be calculated based upon the target flow rate for the material through the nozzle 31 and the pressure-flow relationship, as described above in aspects of the process 200. In addition, the operating pressure of the coating system 10 may be set to the first operating pressure. For example, under command of the controller 18 the operation of the pump of the pressurized liquid supply 38 may be adjusted to increase or decrease the operating pressure of the material supplied to the applicator 16 to set the coating system 10 to the first operating pressure.

Upon completion of the control routine, at step 412, a substrate 12, or portion thereof, may be coated with the material. That is, at least a part of the substrate 12 may be sprayed with the material flowing through the nozzle 31 while the coating system 10 is operated at the first operating pressure. At least some of the steps of the process 400 may be iterative. For example, the process 400 may be restarted at step 402 to recalculate the flow rate and adjust the operating pressure of the coating system 10. In particular, it may be determined that at least one of a property of the material (e.g., viscosity) has changed, a structure of the spray nozzle 31 (e.g., an expansion due to an increase in temperature) has changed, and a difference between an operating flow rate and the target flow rate may be determined to be outside of a predetermined control range, as described above in aspects of the process 200. As a result, the pressure-flow relationship between operating pressure of the coating system 10 and flow rate of the material through the nozzle 31 utilized in step 406 may no longer be representative of the material/coating system 10. Accordingly, the process 400 may be restarted at step 402. In addition, step 412 may be repeated to coat at least portions of additional substrates 12, and so forth.

Figure 5:
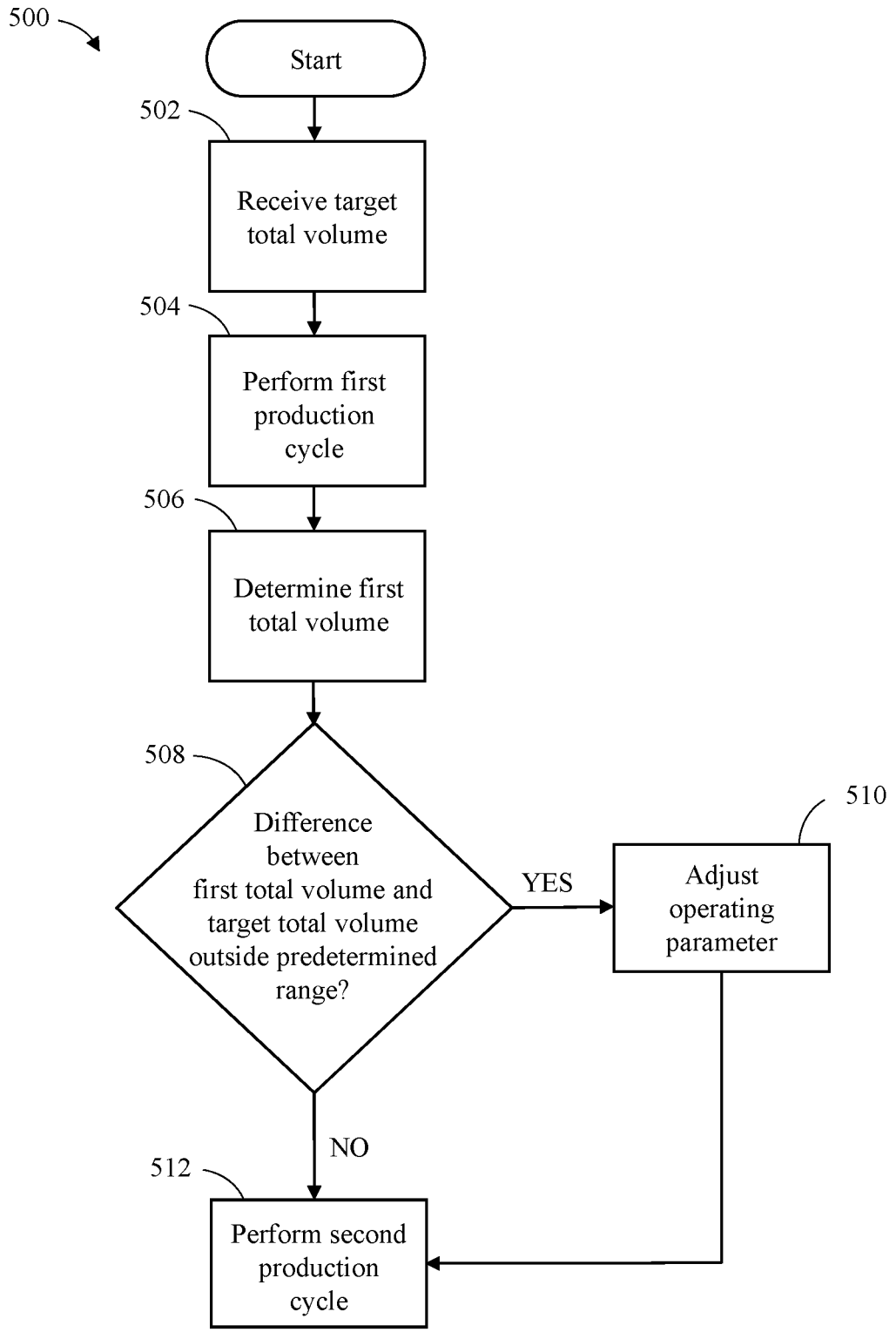
FIG. 5 illustrates a flow diagram of still another exemplary method in accordance with an embodiment of the invention.

FIG. 5 illustrates a flow diagram of yet another exemplary process 500 for calibrating flow rate of a material applied to one or more substrates 12 through the nozzle 31 of the coating system 10. The process 500 may be executed, at least in part, by the motion controller 26 and/or controller 18. Generally, the process 500 may include a flow control routine (steps 502-512) including receiving a target total volume, performing a first production cycle, and determining a total volume of material for the first production cycle. The process 500 may further include comparing the first total volume and the target total volume and determining whether to adjust a parameter of a coating application routine based upon the comparison.

In particular, the process 500 may include coating one more substrates 12 in accordance with one or more production cycles performed by the coating system 10. During performance of the one or more production cycles, one or more substrates 12 may be matched by the controller 18 with a coating application routine. As discussed above, the coating application routine may be a particular operational program that, when executed by the controller 18, causes the coating system 10 to spray specific areas of the one or more substrates 12 with predetermined amounts of liquid coating material flowing from the nozzle 31. The production cycle and associated coating application routine may be generated by a user and entered into the controller 18 via the HMI device 19. Additionally or alternatively, aspects of the production cycle and/or coating application routine may be determined in accordance with any of the processes described herein. When more than one production cycle is performed, the process 500 may include controlling the coating system 10 to maintain consistency of the coating process across production cycles based upon measurements of the volume of material flowing through the coating system 10 (e.g., made in situ via the flow meter 52) across the various production cycles.

For example, at step 502, the controller 18 may receive a target total volume for the material flowing through the coating system 10 during a coating application routine and may store the received target total volume in the memory 44. The target total volume may be entered into the controller 18 by a user via the HMI device 19.

Alternatively, the target total volume may be set by the coating system 10 based upon volume measurements collected during an actual performance of a production cycle. For example, the coating system 10 may perform a calibration production cycle by spraying the one or more substrates 12 with material flowing through the nozzle 31 while the coating system 10 operates a coating application routine. The controller 18 of the coating system 10 may collect, concurrently with the performance of the calibration production cycle, calibration volume measurements of the material flowing through the coating system 10 during operation of the coating application routine. For example, volume measurements may be collected by the flow meter 52. The controller 18 may determine, subsequent to a completion of the performance of the calibration production cycle and based upon the collected calibration volume measurements, a calibration total volume of the material that flowed through the coating system 10 during the coating application routine. The calibration total volume may be determined, for example, by a summation of each of the in situ calibration volume measurements collected during the calibration production cycle, as would be readily understood by a person having ordinary skill in the art. Upon determining the calibration total volume, the controller 18 may set the target total volume to a value equivalent to the calibration total volume. Thus, the target total volume may be set in response to an actual performance of the production cycle with the coating system 10 operating the coating application routine.

After the target total volume is set, at step 504 of the process 500 the coating system 10 may perform one or more subsequent production cycles, e.g., a first production cycle, with the coating system 10 operating the same, or a substantially similar, coating application routine. Performance of the first production cycle may include spraying one or more substrates 12 with the material flowing through the nozzle 31 of the coating system 10 operating the coating application routine.

A step 506, the controller 18 may collect, concurrently with the performance of the first production cycle, first volume measurements of the material flowing through the coating system 10 during the coating application routine. As discussed above, volume measurements may be collected, for example, by the flow meter 52. The controller 18 may determine, subsequent to a completion of the performing of the first production cycle and based upon the collected first volume measurements, a first total volume of the material that flowed through the coating system 10 during the coating application routine.

At step 508, the controller 18 may compare the first total volume with the target total volume. According to embodiments of the invention, the controller 18 may determine whether a difference between the first total volume and the target total volume is outside of a predetermined volume control range. The predetermined volume control range may, for example, be within ±5% of the target total volume. In other embodiments, the predetermined volume control range may be within ±1% of the target total volume. If the controller 18 determines that the difference between the first total volume and the target total volume is within the predetermined volume control range, the process may proceed directly to step 512 and the controller 18 may direct the coating system 10 to perform subsequent production cycles without adjustment of the coating application routine.

Alternatively, if the controller 18 determines that the difference between the first total volume and the target total volume is outside of the volume control range, the process 500 may proceed to step 510 at which the controller 18 may adjust an operating parameter of the coating application routine prior to performance of subsequent production cycles. The operating parameter of the coating application routine may be adjusted in a manner predicted to compensate for the difference between the first total volume and the target total volume to maintain consistency of the coating process across production cycles. For example, the operating parameter of the coating application routine adjusted by the controller 18 may include a velocity of the applicator 16 of the coating system 10 and/or a pressure of the material flowing through the coating system 10. The operating parameter of the coating application routine may be adjusted in proportion to the difference between the first total volume and the target total volume. For example, if the first total volume is determined to be less than the target total volume, the velocity of the applicator 16 may be decreased and/or the pressure of the material flowing through the coating system 10 may be increased in proportion to the difference between the first total volume and the target total volume, and vice versa.

In some embodiments, the operating parameter may be adjusted even when the controller 18 determines that the difference between the first total volume and the target volume is within the volume control range. For example, the controller 18 may store in the memory 44 a plurality of total volume measurements collected from a plurality of completed production cycles. The controller 18 may determine that a rate of change between the total volume measurements across the plurality of completed production cycles has reached a predetermined threshold and may adjust the operating parameter in response thereto.

The process may conclude at step 512, whereby the coating system 10 may perform one or more subsequent production cycles. If the operating parameter is adjusted at step 510, at least some of the subsequent production cycles may be performed using the adjusted operating parameter. For example, once the operating parameter of the coating application routine is adjusted, the coating system 10 may perform one or more subsequent production cycles by spraying the one or more substrates 12 with the material flowing through the nozzle 31 of the coating system 10 operating the coating application routine with the adjusted operating parameter. Alternatively, if the process 500 proceeds directly from step 508 to step 512, subsequent production cycles may be performed without adjustment of the operating parameters of the coating application routine. According to aspects of the invention, by monitoring the total volume across production cycles variations in material flow over time may compensated in a simplified manner.

At least some of the steps of the process 500 may be iterative. For example, the process 500 may be restarted at step 502 for each production cycle iteration to continuously monitor material flow across production cycles.

While the disclosure has been described in connection with the various embodiments of the various figures, it is to be understood that other similar embodiments can be used or modifications and additions can be made to the described embodiments. Therefore, the methods and systems as described herein should not be limited to any single embodiment, but rather should be construed in breadth and scope in accordance with the appended claims.

What is claimed is:

1. A method of calibrating flow rate of a material through a spray nozzle of a coating system for applying the material to a substrate, the method comprising:
    ejecting the material from the spray nozzle with the coating system set to a first calibrating pressure and determining a first flow rate of the material ejected from the spray nozzle;
    calculating a pressure-flow relationship between operating pressure of the coating system and flow rate of the material through the spray nozzle at least based upon the first calibrating pressure and the first flow rate and generating a model based on at least the first calibrating pressure and the first flow rate;
    receiving a target flow rate for the material through the spray nozzle;
    calculating a first operating pressure of the coating system based upon the target flow rate for the material through the spray nozzle and the pressure-flow relationship;
    setting an operating pressure of the coating system to the first operating pressure;
    ejecting material from the spray nozzle on at least part of a surface with the material flowing through the spray nozzle at the first operating pressure of the coating system;
    determining an operating flow rate of the material at the first operating pressure of the coating system;
    comparing the operating flow rate to the target flow rate;
    adjusting, subsequent to the comparing of the operating flow rate to the target flow rate, the operating pressure of the coating system to a second operating pressure; and
    spraying at least part of the substrate with the material flowing through the spray nozzle at the second operating pressure of the coating system.

2. The method according to claim 1, wherein
    the surface is provided within a container, and
    the determining of the operating flow rate of the material is based upon a measurement of an amount of material ejected from the spray nozzle into the container over an amount of time the material was ejected.

3. The method according to claim 1, wherein the operating flow rate of the material is determined in situ.

4. The method of claim 1, wherein the determining of the operating flow rate of the material includes:
    measuring at least one of a volume and a weight of the material ejected from the coating system; and
    measuring an amount of time that the material is ejected.

5. The method according to claim 1, further comprising:
    receiving operating parameters for the coating system, the operating parameters comprising a target coating thickness of the material, a target coating width of the material, a solids percentage of the material, and a velocity of an applicator of the coating system; and
    prior to receiving the target flow rate, calculating the target flow rate for the material through the spray nozzle based upon the operating parameters for the coating system.

6. The method according to claim 5, wherein the calculating of the target flow rate for the material through the spray nozzle based upon the operating parameters for the coating system is based on a target flow rate equation, the target flow rate equation comprising:

$$\left(\frac{T \times W}{\frac{P}{100}}\right) \times S = FR;$$

wherein
    T is the target coating thickness of the material operating parameter,
    W is the target coating width of the material operating parameter,
    P is the solids percentage of the material operating parameter,
    S is the velocity of the applicator of the coating system operating parameter, and
    FR is the target flow rate.

7. The method according to claim 6, further comprising:
    determining that the target flow rate is outside of a predetermined flow rate capacity range of the coating system and, in response, setting the target flow rate to a set target flow rate within the predetermined flow rate capacity range; and
    adjusting the velocity of the applicator operating parameter to an adjusted velocity.

8. The method according to claim 7, wherein the adjusting of the velocity of the applicator operating parameter to the adjusted velocity includes determining the adjusted velocity based on an adjusted velocity equation, the adjusted velocity equation comprising:

$$\left(\frac{\frac{P}{100}}{T \times W}\right) \times FR' = S';$$

wherein
    FR' is the set target flow rate, and
    S' is the adjusted velocity.

9. The method of claim 1, wherein prior to adjusting the operating pressure of the coating system, the method further comprising determining, in response to the comparing of the operating flow rate to the target flow rate, that a difference between the operating flow rate and the target flow rate is outside of a predetermined control range.

10. The method of claim 9, further comprising:
recalibrating the pressure-flow relationship between operating pressure of the coating system and the flow rate of the material through the spray nozzle subsequent to the determining that the difference between the operating flow rate and the target flow rate is outside of the predetermined control range and prior to the adjusting of the operating pressure of the coating system to the second operating pressure, and
calculating the second operating pressure of the coating system, based upon the target flow rate for the material through the spray nozzle and the recalibrated pressure-flow relationship.

11. The method of claim 10, wherein the recalibrating of the pressure-flow relationship comprises:
ejecting the material from the spray nozzle with the operating pressure of the coating system set to a first calibrating pressure, and determining a first flow rate of the material ejected from the spray nozzle;
adjusting the operating pressure of the coating system to a second calibrating pressure that is different from the first calibrating pressure;
ejecting the material from the spray nozzle with the operating pressure of the coating system set to the second calibrating pressure, and determining a second flow rate of the material ejected from the spray nozzle; and
calculating the recalibrated pressure-flow relationship between operating pressure of the coating system and flow rate of the material through the spray nozzle at least based upon the first calibrating pressure, the first flow rate, the second calibrating pressure, and the second flow rate.

12. The method of claim 9, further comprising:
determining an operating flow rate of the material at the second operating pressure of the coating system; and
determining, prior to spraying the substrate at the second operating pressure of the coating system, that a difference between the operating flow rate of the material at the second operating pressure and the target flow rate is within the predetermined control range.

13. The method of claim 9, wherein
the ejecting at the first operating pressure of the coating system includes spraying the material from the spray nozzle and the surface is part of another substrate, the determining of the operating flow rate and the comparing of the operating flow rate to the target flow rate occur concurrently with the spraying of the at least part of the surface of the another substrate, and
the method further comprises adjusting a velocity of an applicator of the coating system in response to the determining that the difference between the operating flow rate and the target flow rate is outside of the predetermined control range and concurrently with the spraying of the at least part of the surface of the another substrate.

14. The method of claim 13, wherein the adjusting of the velocity of the applicator of the coating system includes increasing or decreasing the velocity of the applicator of the coating system in proportion to the difference between the operating flow rate and the target flow rate.

15. The method of claim 14, wherein the adjusting of the velocity of the applicator operating parameter includes setting the velocity of the applicator to an adjusted velocity and determining the adjusted velocity based on an adjusted velocity equation, the adjusted velocity equation comprising:

$$\left(\frac{\frac{P}{100}}{T \times W}\right) \times FR'' = S';$$

wherein
T is a target coating thickness of the material operating parameter,
W is a target coating width of the material operating parameter,
P is a solids percentage of the material operating parameter,
FR" is the operating flow rate, and
S' is the adjusted velocity.

16. The method of claim 1, further comprising, prior to the spraying of the at least part of the substrate, setting a vertical distance between an outlet of the spray nozzle and a nozzle-facing surface of the substrate that is predicted to achieve a target coating width of the material.

17. The method of claim 16, further comprising calculating the vertical distance between the outlet of the spray nozzle and the nozzle-facing surface of the substrate based upon a target coating width equation, the target coating width equation comprising:

$$\frac{W}{2 \times \tan\left(\frac{\theta}{2}\right)} = H;$$

wherein
W is the target coating width of the material,
θ" is an angle formed by a spray pattern of the material emanating from the spray nozzle, and
H is the vertical distance between the outlet of the spray nozzle and the nozzle-facing surface of the substrate.

18. The method of claim 1, wherein
the operating flow rate is a first operating flow rate,
prior to the adjusting the operating pressure of the coating system to the second operating pressure, the method further comprising:
determining, in response to the comparing of the operating flow rate to the target flow rate, that a difference between the first operating flow rate and the target flow rate is within a predetermined control range and subsequently spraying at least part of the substrate or another substrate with the material flowing through the spray nozzle at the first operating pressure of the coating system;
determining, subsequent to the spraying of the at least part of the substrate or the another substrate, a second operating flow rate of the material at the first operating pressure, the second operating flow rate being different from the first operating flow rate; and
calculating a rate of change between the first operating flow rate and the second operating flow rate, and
the adjusting the operating pressure of the coating system to the second operating pressure is in response to the rate of change between the first and second operating flow rates.

19. The method of claim 1, wherein the spraying at least part of the substrate with the material flowing through the spray nozzle at the second operating pressure of the coating system comprises:

receiving a target total volume for the material flowing through the coating system during a coating application routine;

performing a first production cycle by spraying one or more substrates, the one or more substrates at least including the substrate, with the material flowing through the spray nozzle of the coating system operating the coating application routine;

collecting, concurrently with the performing of the first production cycle, first volume measurements of the material flowing through the coating system during the coating application routine;

determining, subsequent to a completion of the performing of the first production cycle and based upon the first volume measurements, a first total volume of the material that flowed through the coating system during the coating application routine;

comparing the first total volume with the target total volume;

determining, in response to the comparing of the first total volume to the target total volume, that a difference between the first total volume and the target total volume is outside of a predetermined volume control range and subsequently adjusting an operating parameter of the coating application routine; and performing, subsequent to the adjustment of the operating parameter of the coating application routine, a second production cycle by spraying the one or more substrates with the material flowing through the spray nozzle of the coating system operating the coating application routine with the adjusted operating parameter.

20. A method of calibrating flow rate of a material through a spray nozzle of a coating system for applying the material to a substrate, the method comprising:

receiving a target flow rate for the material through the spray nozzle;

calculating a first operating pressure of the coating system based upon the target flow rate for the material through the spray nozzle and a pressure-flow relationship between operating pressure of the coating system and flow rate of the material through the spray nozzle;

setting an operating pressure of the coating system to the first operating pressure;

ejecting material from the spray nozzle on at least part of a surface with the material flowing through the spray nozzle at the first operating pressure of the coating system;

determining an operating flow rate of the material at the first operating pressure of the coating system;

comparing the operating flow rate to the target flow rate;

determining, in response to the comparing of the operating flow rate to the target flow rate, that a difference between the operating flow rate and the target flow rate is within a predetermined control range;

adjusting, subsequent to the comparing of the operating flow rate to the target flow rate and the determination that the difference between the operating flow rate and the target flow rate is within the predetermined control range, the operating pressure of the coating system to a second operating pressure; and spraying at least part of the substrate with the material flowing through the spray nozzle at the second operating pressure of the coating system.

21. A method of calibrating a coating system comprising:

receiving a target total volume for a material flowing through a coating system during a coating application routine;

performing a first production cycle by spraying one or more substrates with the material flowing through a spray nozzle of the coating system operating the coating application routine;

collecting, concurrently with the performing of the first production cycle, first volume measurements of the material flowing through the coating system during the coating application routine;

determining, subsequent to a completion of the performing of the first production cycle and based upon the first volume measurements, a first total volume of the material that flowed through the coating system during the coating application routine;

comparing the first total volume with the target total volume;

determining, in response to the comparing of the first total volume to the target total volume, that a difference between the first total volume and the target total volume is within a predetermined volume control range and subsequently adjusting an operating parameter of the coating application routine; and performing, subsequent to the adjustment of the operating parameter of the coating application routine, a second production cycle by spraying the one or more substrates with the material flowing through the spray nozzle of the coating system operating the coating application routine with the adjusted operating parameter.

22. The method of claim 21, wherein:

the operating parameter of the coating application routine comprises at least one of a velocity of an applicator of the coating system and a pressure of the material flowing through the coating system.

23. The method of claim 22, wherein the adjusting of the operating parameter of the coating application routine comprises adjusting at least one of the velocity of the applicator of the coating system and the pressure of the material flowing through the coating system.

24. The method of claim 23, wherein the adjusting of the operating parameter of the coating application routine comprises adjusting the at least one of the velocity of the applicator of the coating system and the pressure of the material flowing through the coating system in proportion to the difference between the first total volume and the target total volume.

25. The method of claim 21, further comprising prior to the receiving of the total target volume:

performing a calibration production cycle by spraying the one or more substrates with the material flowing through the spray nozzle of the coating system operating the coating application routine;

collecting, concurrently with the performing of the calibration production cycle, calibration volume measurements of the material flowing through the coating system during operation of the coating application routine;

determining, subsequent to a completion of the performing of the calibration production cycle and based upon the calibration volume measurements, a calibration total volume of the material that flowed through the coating system during the coating application routine; and setting the target total volume to a value equivalent to the calibration total volume.

* * * * *